United States Patent [19]

Tezuka

[11] Patent Number: 4,771,730

[45] Date of Patent: Sep. 20, 1988

[54] VACUUM PROCESSING APPARATUS WHEREIN TEMPERATURE CAN BE CONTROLLED

[75] Inventor: Masashi Tezuka, Zama, Japan

[73] Assignee: Kabushiki Kaisha Tokuda Seisakusho, Kanagawa, Japan

[21] Appl. No.: 94,820

[22] Filed: Sep. 9, 1987

[30] Foreign Application Priority Data

Sep. 12, 1986 [JP] Japan .................. 61-215333

[51] Int. Cl.$^4$ .................. C23C 14/34; C23C 16/00
[52] U.S. Cl. .................. 118/723; 118/724; 118/725; 118/728; 204/298; 156/345
[58] Field of Search ............. 118/723, 724, 725, 728; 204/298; 156/345

[56] References Cited

U.S. PATENT DOCUMENTS 4,313,783  2/1982  Davies .................. 156/643

Primary Examiner—Richard Bueker
Attorney, Agent, or Firm—Koda and Androlia

[57] ABSTRACT

A vacuum processing apparatus has a vacuum vessel within which a work to be processed is drawn and held fixed on a specimen table by an electrode functioning doubly as an electrostatic chuck, to which is connected a gas feeding pipe for feeding a gas affording good heat transmission between the mutually contacting surfaces of the work and the electrode thereby to control the temperature of the work.

7 Claims, 3 Drawing Sheets

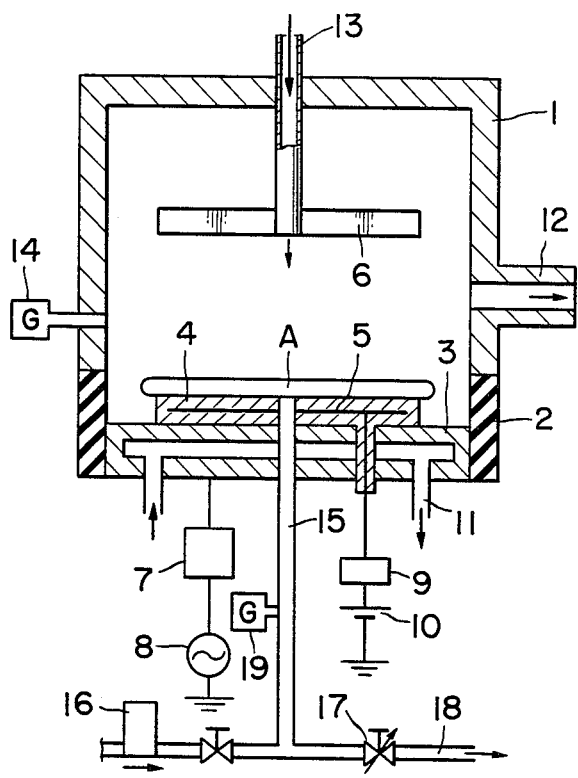
F I G. 1
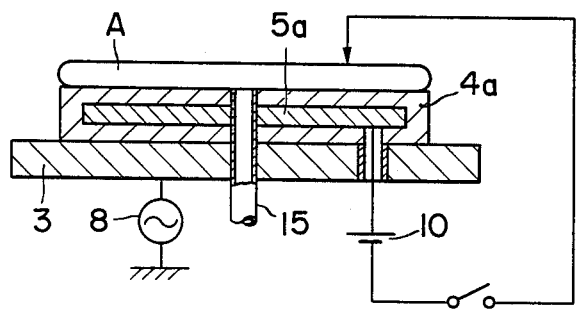
F I G. 2

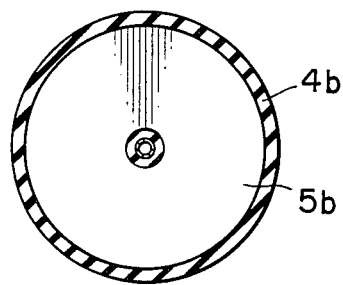
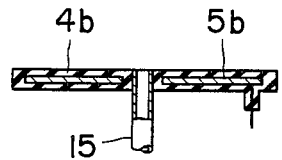
FIG. 3(a)    FIG. 3(b)
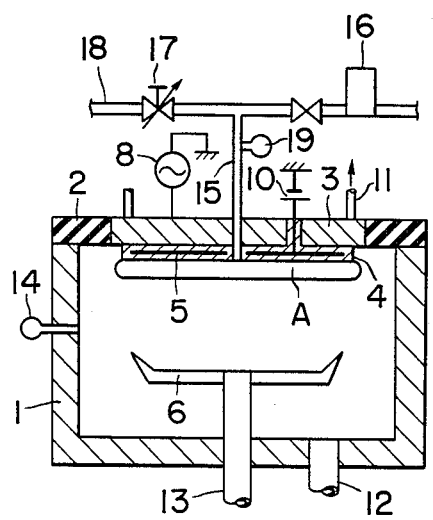
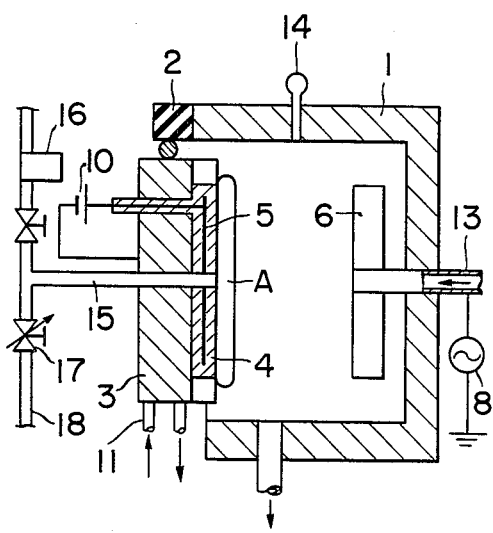
FIG. 4    FIG. 5

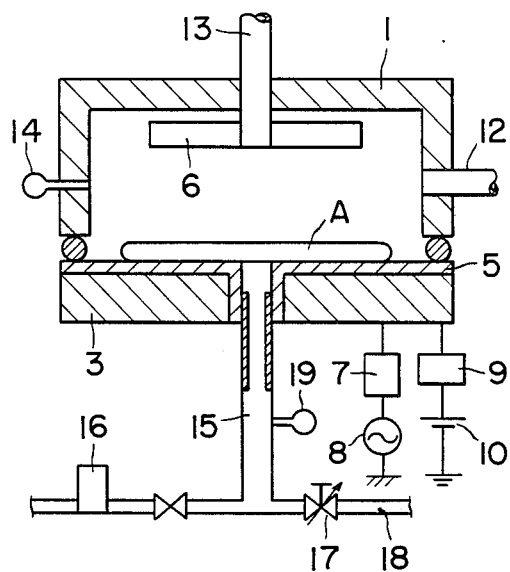
F I G. 6
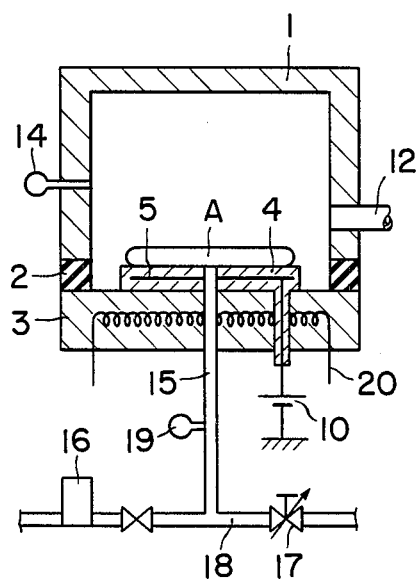
F I G. 7

VACUUM PROCESSING APPARATUS WHEREIN TEMPERATURE CAN BE CONTROLLED

BACKGROUND OF THE INVENTION

This invention relates generally to vacuum processing apparatuses and more particularly to a vacuum processing apparatus in which the temperature of a substance or an article being processed within a vacuum vessel can be controlled accurately and positively within a short time.

Various vacuum processing apparatuses have been and are being developed for processing articles or materials to be processed (hereinafter referred to as "work"), such as semiconductor wafers, within a vacuum chamber, examples of such processes being etching, sputtering, ion injection, plasma CVD, electron beam irradiation, and vapor deposition.

For example, when work such as a semiconductor wafer is to be vacuum processed with a gas plasma, the work is cooled in order to protect its resist film. In this case, when the processing is to be carried out at a low processing power density, for example, of 0.3 W/cm$^2$ or less, it is suffient merely to place the work on a specimen table which is being cooled.

On the other hand, in the case of processing at a high processing power density (of 0.3 W/cm$^2$ or higher), use is made of means for cooling by mechanically pressing the work against the specimen table being cooled. In another cooling method being practiced, a narrow space is formed between the specimen table and the work and is sealed by means such an an O ring, and, while a cooling gas is introduced into this space, the work is mechanically pressed against the specimen table.

Furthermore, a recently proposed vacuum processing technique comprises interposing a dielectric film between the cooled speciment table and the work, providing a direct-current electric circuit formed by utilizing the electroconductive property of a gas plasma, and imparting a potential difference between the specimen table and the work thereby to cause the work to be drawn firmly on the dielectric film against the specimen table (as disclosed in Japanese Patent Application Publn. No. 53853/1981).

However, in the practice of the above described technique, although no problem is encountered as to cooling capacity during low-power processing, the problem of insufficient cooling has arisen in the case of high-speed processing at a high power density of, for example, 0.8 W/cm$^2$ or higher.

Furthermore, in the process of cooling the work as it is mechanically pressed as described above, there is the risk of an excessive load being applied to the work. Moreover, since non-uniform parts of the pressing device contact the work, they impart a deleterious effect on the work, and dust tends to infiltrate into the interfacial space between the work and the pressing member.

The technique of forming a narrow space between the specimen table and the work, pressing the work mechanically against the table, and cooling the same with a cooling gas has heretofore entailed the risk of damaging the surface of the work. A further problem has been the difficulty of carrying out uniform processing due to the difference between the impedances of the gas-cooled parts and other parts of the work.

In addition, in the technique of causing the work to adhere to the specimen table over a dielectric film interposed therebetween, also, there has been a problem of difficulty of cooling or heating the work to a specific temperature because of lowering of the thermal conductivity due to the formation of a vacuum layer in the interfacial interstice between the opposed surfaces of the specimen table and the work. This interstice inevitably exists as a consequence of the fact the opposed surfaces are not perfectly planar surfaces.

SUMMARY OF THE INVENTION

Accordingly, it is an object of this invention to provide a vacuum processing apparatus in which the above described problems encountered in the prior art are overcome, and in which, during vacuum processing of a work in the vacuum processing chamber of the apparatus, the temperature of the work can be controlled accurately and positively.

According to this invention, in order to achieve the above and other objects thereof, there is provided a vacuum processing apparatus wherein temperature can be controlled comprising: a vacuum vessel the interior of which constitutes a vacuum processing chamber, in which a work is to be vacuum processed; a specimen table installed in and at one side of the processing chamber and provided with means for controlling the temperature thereof; an electrode mounted on said specimen table and within said chamber and being functionable as an electrostatic chuck to fixedly hold the work, said electrode comprising an electrode plate and a dielectric film covering the electrode plate and a gas feeding pipe for introducing a gas for affording good heat transmission into the interfacial interstice between the wrok thus held and the electrode.

According to this invention, the work is drawn and fixed relative to the specimen table by an electrode functioning as an electrostatic chuck, and, by heat transmitted from the temperature-regulated specimen table, the work is temperature regulated. Then, a gas for affording good heat transmission is introduced between the interface contact surfaces of the work and the electrode and is diffused along the contact surface of the work, whereby the temperature of the work is accurately and positively controlled in a short time.

Thus, according to this invention, the electrode or electrostatic chuck is mounted on the temperature-controlled specimen table, and, by means of a pipe passed through this electrode, a gas for affording good heat transmission is introduced to the reverse surface of work, whereby the work is caused to adhere evenly and be thus fixed by the electrostatic chuck relative to the upper surface of the specimen table. At the same time, as a result of the diffusion of the gas for affording good heat transmission which has been introduced along the reverse surface of the work, the temperature of the work is controlled accurately and positively in a short time. Furthermore, since mechanical action is unnecessary, damaging of the work or imparting of adverse effect thereto can be positively prevented.

The nature, utility, and further features of this invention will be more clearly apparent from the following detailed description with respect to preferred embodiments of the invention when red in conjunction with the accompanying drawings, briefly described below.

BRIEF DESCRIPTION OF THE DRAWINGS

In the accompanying drawings:

FIG. 1 is a schematic view, partly in section and partly as electrical connection and piping diagrams, showing one example of the vacuum processing apparatus according to this invention;

FIG. 2 is a sectional view showing the construction of an electrode covered by a dielectric film;

FIG. 3(a) is a sectional view taken along a plane perpendicular to the axis of an electrode illustrating another example of electrode construction;

FIG. 3(b) is a side sectional view of the same electrode shown in FIG. 3(a); and FIGS. 4 through 7 are schematic views similar to FIG. 1 respectively showing other examples of the vacuum processing apparatus according to the invention.

DETAILED DESCRIPTION OF THE INVENTION

In one example of the vacuum processing apparatus according to this invention as illustrated in FIG. 1, the principal structure is a vacuum vessel 1 with an interior functioning as a vacuum processing chamber. The bottom of this vacuum vessel 1 is formed by a specimen table 3 serving also as an electrode and secured via an electrical insulation material 2 to the lower part of the side walls of the vacuum vessel 1. To the upper surface of this specimen table 3 is fixed and electrode 5 for use as an electrostatic chuck, which is covered by a dielectric film 4. An opposite electrode 6 is positioned within the vacuum processing chamber coaxially above and in opposition to the electrode 5.

The electrode 5 comprises, for example, an electrode plate 5a made of aluminum and an inorganic insulative dielectric film 4a of $Al_2O_3$ covering the entire outer surface of the electrode plate 5a as shown in FIG. 2. Instead of the $Al_2O_3$ film, an oxide film of aluminum nitride can also be used. FIG. 3 illustrates an example of an electrode plate 5b made of copper and covered entirely by an organic insulative dielectric film 4b of a polyimide. In addition, it is possible to use other metal materials for the plate of the electrode 5 and to cover it with a dielectric film 4 of polytetrafluoroethylene, $SiO_2$, or some other suitable dielectric material.

The specimen table 3 is electrically connected by way of a matching circuit 7 to a high-frequency power supply 8 capable of applying high-frequency power to the specimen table 3. To the electrode 5 is connected a direct-current power supply 10 by way of a high-frequency circuit-breaker circuit 9.

In the instant example, the specimen table 3 is cooled and maintained at a specific temperature by cooling water supplied from cooling means (not shown) and introduced via cooling piping 11 into the interior of the specimen table 3.

An air exhaust pipe 12 connected at its downstream end to an evacuation device (not shown) is communicatively connected at its upstream end to the side wall of the vacuum vessel 1. Through the upper wall of the vessel 1 is connected a gas supply pipe 13 for introducing processing gas into the vacuum processing chamber. A pressure gage 14 is provided at one side of the vacuum vessel 1 for determining the pressure within the vacuum processing chamber. The gas supply pipe 13 extends through and is fixed to the central part of the aforedescribed opposite electrode 6, and the process gas supplied through this gas supply pipe 13 is directed to flow toward the specimen table 3.

Cooling gas can be supplied into the interior of the vacuum vessel 1 from a cooling gas source (not shown), through supply piping 15a provided with a gas flow rate control valve 16, and through a cooling gas feeding pipe 15, which extends upward through the specimen table 3 and the electrode 5 and communicatively opens into the vacuum processing chamber. At the junction between the supply piping 15a and the cooling gas feeding pipe 15 is connected the upstream end of a gas discharge piping path 18, which is provided at a part thereof with a variable valve 17. A pressure gage 19 is connected to a part of the cooling gas feeding pipe 15.

The example of the vacuum processing apparatus according to this invention of the above described organization is operated in the following manner. First, work a is placed on the upper surface of the electrode serving as an electrostatic chuck, and then the interior of the vacuum vessel 1 constituting the vacuum processing chamber is evacuated through the air exhaust pipe 12 by the evacuation device (not shown). At the same time, a direct-current voltage is impressed by the direct-current power supply 10 on the electrode 5, whereby the work A is electrostatically drawn and held against the upper surfce of the specimen table 3 by way of the electrode 5 interposed therebetween.

Then, when the pressure within the processing chamber reaches the desired vacuum pressure, high-frequency power is applied by the high-frequency power supply 8 via the matching circuit 7 to the specimen table 3 as a process gas such as argon supplied from a process gas generator (not shown) is introduced through the gas supply pipe 13 into the processing chamber thereby to carry out etching processing, for example, of the work. The processing pressure within the processing chamber can be controlled by observing the pressure indicated by the pressure gage 14 and appropriately adjusting the flow rates of the gases introduced into the chamber.

In this case, the cooling gas fed through the cooling gas feeding pipe 15 is introduced into the interstice between the work A and the electrode 5 functioning as an electrostatic chuck. As a consequence, a gas serving to improve heat transmission is introduced along that face of the work A which is being drawn against the electrode 5. The pressure of this cooling gas is controlled at a specific desired value by observing the indication of the pressure gage 19 and manipulating the flow rate control valve 16 and the variable valve 17. The cooling gas can be selected from $N_2$, Ar, He, and other suitable gases, and its temperature can be freely set in accordance with the desired processing temperature.

Upon completion of the processing of the work A, the power supplies 8 and 10 are turned off, and the work A is taken out of the apparatus.

Thus, according to this invention, the cooling of the work A is accomplished by the flow of the cooling water through the interior of the specimen table 3 and by the introduction of the cooling gas, which is fed through the supply pipe 15 to the reverse or lower surface of the work A to become a good heat transmitting medium and diffuses uniformly in the infinitesimally narrow gap of the order of microns between the work A and the electrode 5, whereby cooling the entire outer surface of the work.

An apparatus according to the above described example of the invention was utilized as a high-speed reactive ion etching (RIE) apparatus. The temperatures therewithin during processing with different power rates were measured by means of a thermolabel, whereupon the results shown in the following table were obtained.

| Power W/cm² | Temperatures during processing | | | | |
|---|---|---|---|---|---|
| | Prior-art gas cooling (°C.) | Held by gravity only (°C.) | Electrostatic chuck only (°C.) | Mechanical chuck (°C.) | Instant example of invention (°C.) |
| 0.2 | 20 | 40 | 20 | 20 | 20 |
| 0.4 | 20 | 60 | 20 | 30 | 20 |
| 0.6 | 40 | 100 | 60 | 80 | 20 |
| 0.8 | 50 | 200 | 110 | 150 | 25 |
| 1.0 | 80 | — | 200 | — | 25 |
| 1.2 | 150 | — | — | — | 30 |
| 1.4 | — | — | — | — | 35 |

According to the above results of the experiment, the cooling performance of the above described example apparatus of the invention is indicated as being higher than that of the known cooling means. It is apparent that, particularly with a power density of 1 W/cm² or higher, only the instant example apparatus is capable of carrying out cooling.

While, in the above described example, the cooling gas feeding pipe 15 has been described as being a single pipe passing through the center of the electrode 5, the arrangement of this pipe 15 is not so limited but may take other forms such as that of a plurality of pipes provided around the peripheral part, instead of the center, of the electrode 5, or that of grooves or slots to direct the cooling gas.

This invention may be embodied in various other forms as illustrated by other examples of practice of its apparatus shown in FIGS. 4 through 7. In the example illustrated in FIG. 4, the electrode 5 is disposed at the upper part of the processing chamber within the vacuum vessel 1, and the opposite electrode 6 for functioning as a carrying device capable of raising and lowering the work A is disposed at a lower part of the processing chamber. In the example shown in FIG. 5, the two electrodes 5 and 6 are disposed to lie in vertical planes in confrontal position on opposite side of the work A also lying in a vertical plane. The other organizational features of this apparatus are the same or similar to those of the preceding example shown in FIG. 1.

In all of the above described examples of the apparatus according to this invention, the cooling of the work A can be equally carried out with high efficiency.

Furthermore, as shown in FIG. 6, the specimen table 3 and the electrode 5 may be formed as a single integral structure. Also, as shown in FIG. 7, a heater 20 can be imbeddedly installed within the specimen table 3, thereby making possible efficient raising of the temperature of the work A even in a vacuum. In this case, it is also possible to supply heated gas through the gas feeding pipe 15.

What is claimed is:

1. A vacuum processing apparatus wherein temperature can be controlled comprising:
   a vacuum vessel the interior of which constitutes a vacuum processing chamber, in which a work is to be vacuum processed;
   a specimen table installed in and at one side of the processing chamber and provided with means for controlling the temperature thereof;
   an electrode mounted on said specimen table and within said chamber and being functionable as an electrostatic chuck to fixedly hold the work, said first electrode comprising an electrode plate and a dielectric film covering the electrode plate;
   a gas feeding pipe for introducing a gas for affording good heat transmission into the interfacial interstice between the work thus held and the first electrode.

2. A vacuum processing apparatus as claimed in claim 1 in which said electrode comprises an electrode made of aluminum and an inorganic, insulative, dielectric film of $Al_2O_3$ covering the outer surface of said aluminum electrode.

3. A vacuum processing apparatus as claimed in claim 1 in which said electrode comprises an electrode made of copper and an organic, insulative, dielectric film of a polyimide covering the outer surface of said copper electrode.

4. A vacuum processing apparatus as claimed in claim 1 in which said electrode is mounted on the lower surface of the ceiling wall of the vacuum processing chamber.

5. A vacuum processing apparatus as claimed in claim 1 in which said electrode is mounted on the inner surface of a side wall of the vacuum processing chamber.

6. A vacuum processing apparatus as climed in claim 1 in which a heating device is imbeddedly provided in the specimen table.

7. A vacuum processing apparatus as claimed in claim 1 in which said gas for affording good heat transmission is a cooling gas.

* * * * *